(12) United States Patent
Desineni et al.

(10) Patent No.: US 7,853,848 B2
(45) Date of Patent: Dec. 14, 2010

(54) SYSTEM AND METHOD FOR SIGNATURE-BASED SYSTEMATIC CONDITION DETECTION AND ANALYSIS

(75) Inventors: Rao H. Desineni, Poughkeepsie, NY (US); Maroun Kassab, St-Eustache (CA); Leah M. Pastel, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 511 days.

(21) Appl. No.: 11/875,975

(22) Filed: Oct. 22, 2007

(65) Prior Publication Data

US 2009/0106614 A1 Apr. 23, 2009

(51) Int. Cl.
- *G01R 31/28* (2006.01)
- *G01R 31/30* (2006.01)
- *G01R 31/26* (2006.01)
- *G01R 31/08* (2006.01)
- *G06F 17/50* (2006.01)

(52) U.S. Cl. .................. 714/732; 714/724; 714/742; 714/745; 714/E11.159; 324/528; 324/531; 324/765; 716/4; 438/14; 438/17

(58) Field of Classification Search .................. 714/724, 714/732, 742, 745, E11.159; 324/528, 531, 324/765; 716/4; 438/14, 17
See application file for complete search history.

(56) References Cited

U.S. PATENT DOCUMENTS

| | | | |
|---|---|---|---|
| 5,497,381 A * | 3/1996 | O'Donoghue et al. ....... | 714/745 |
| 5,513,188 A * | 4/1996 | Parker et al. ................. | 714/727 |
| 5,515,384 A | 5/1996 | Horton, III | |
| 6,701,477 B1 * | 3/2004 | Segal ........................... | 714/732 |
| 6,880,136 B2 | 4/2005 | Huisman et al. | |
| 6,971,054 B2 * | 11/2005 | Kurtulik et al. .............. | 714/732 |
| 7,558,999 B2 * | 7/2009 | Adkisson et al. ............. | 714/737 |
| 7,596,736 B2 * | 9/2009 | Kassab et al. ................ | 714/732 |
| 7,676,077 B2 * | 3/2010 | Kulkarni et al. ............. | 382/144 |
| 2005/0273656 A1 | 12/2005 | Adkisson et al. | |
| 2006/0053357 A1 | 3/2006 | Rajski et al. | |
| 2006/0066338 A1 | 3/2006 | Rajski et al. | |
| 2006/0066339 A1 | 3/2006 | Rajski et al. | |
| 2009/0037134 A1 * | 2/2009 | Kulkarni et al. ............. | 702/127 |

OTHER PUBLICATIONS

Huisman et al., Statistical Diagnosis using Fail Commonalities, ITC, Jan. 19, 2003, pp. 1-9.*

(Continued)

*Primary Examiner*—John J Tabone, Jr.
(74) *Attorney, Agent, or Firm*—Gibb I.P. Law Firm, LLC; Michael J. LeStrange, Esq.

(57) ABSTRACT

Disclosed are embodiments of a system, method and service for detecting and analyzing systematic conditions occurring in manufactured devices. Each embodiment comprises generating a unique signature for each of multiple tested devices. The signatures are generated based on an initial set of signature definitions and the values for those signature definitions that are derived at least in part from selected testing data. A systematic condition is detected based on commonalities between the signatures. The systematic condition is then analyzed, alone or in conjunction with additional information, in order to develop a list of underlying similarities between the devices. The analysis results can be used to refine the systematic condition detection and analysis processes by revising the signature definitions set and/or by modifying data selection.

18 Claims, 4 Drawing Sheets

OTHER PUBLICATIONS

Ferguson, et al., "Extraction and Simulation of Realistic CMOS Faults using Inductive Fault Analysis," IEEE, 1988 International Test Conference, Paper 25.1, pp. 475-484.

Keim, et al., "A Rapid Yield Learning Flow Based on Production Integrated Layout-Aware Diagnosis," 2006 IEEE, International Test Conference, paper 7.1, pp. 1-10.

* cited by examiner

SYSTEM AND METHOD FOR SIGNATURE-BASED SYSTEMATIC CONDITION DETECTION AND ANALYSIS

BACKGROUND

1. Field of the Invention

The embodiments of the invention generally relate to the detection and analysis of systematic conditions occurring in devices manufactured according to the same ground rules and design and, more particularly, to a system and method that uses signature comparisons to detect and analyze systematic conditions occurring in such devices.

2. Description of the Related Art

Device (e.g., chip, integrated circuit, circuit, network, etc.) processing includes establishing ground rules, designing the device, manufacturing a plurality of devices according to the established ground rules and design, and testing the manufactured devices prior to distribution to customers. Similarities between devices can similarly affect device behavior. That is, defects or other similar characteristics that are common to devices manufactured according to the same ground rules and the same design can cause those devices to achieve similar results under test (i.e., to behave or respond the same way under test). Given this relationship, it would be advantageous to provide a system and method that detects similarly behaving devices under test and analyzes these devices to determine the underlying similar characteristic which results in the similar behavior.

SUMMARY

In view of the foregoing, disclosed herein are embodiments of a system, method and service for detecting and analyzing systematic conditions occurring in devices that are manufactured according to the same design and ground rules. Also disclosed are embodiments of a program storage device readable by computer and tangibly embodying a program of instructions executable by that computer to perform this method. Each of the embodiments comprises generating a unique signature for each of multiple tested devices. The unique signatures are generated based on an initial set of signature definitions and the values for those signature definitions are derived at least in part from selected testing data. Systematic conditions (i.e., states, relationships, behaviors, etc., that are detectable under test and that occur non-randomly in devices manufactured according to the same ground rules and design) are detected based on commonalities between the signatures. The systematic condition is then analyzed, alone or in conjunction with additional information, in order to develop a list of underlying similarities between the devices. The analysis results can be used to refine the systematic condition detection and analysis processes by revising the signature definitions set and/or by modifying data selection. The analysis results may also be used to update yield analysis, ground rules, design and layout, manufacturing processes, testing techniques, datalogging procedures, and/or device binning or disposition procedures.

An embodiment of the system comprises a signature definitions selector, a data selector, a signature generator, a systematic condition detector, a systematic condition analyzer and a signature database.

At test a plurality of identical devices (i.e., devices manufactured according to the same design and same ground rules) can be tested in a particular identical and repeatable way, using any number of conventional testing techniques. The results of the test can be observed in some fashion and stored as collected data along with other testing information (e.g., testing conditions, power metrics, etc.).

The signature generator can be adapted to receive selected testing data and other testing information from the data selector. The selected testing data is selected by the data selector from amongst all the data collected and stored during testing. Data selection is based on signature definitions in the initial set and/or on user input. Selected data can include specified observation points (e.g., specified electrical properties, specified physical properties, specified performance information, etc.). Other testing information can include, but is not limited to, specified environmental information, any statistically abnormal data, specified power metrics, specified electrically coded information and specified manufacturing process information. The signature generator is further adapted to receive an initial set of signature definitions from the signature definitions selector. Signature definitions can comprise, for example, electrical properties, physical properties, performance information, environmental information, statistically abnormal data, power metrics, electrically coded information and manufacturing process information. The initial set of signature definitions can comprise a default set, a user selected set or a user-customized set. The signature generator can further be adapted to generate a unique signature for each manufactured device based on this initial set of signature definitions and the values for those signature definitions as derived from the selected data and, if applicable, from other testing information.

The systematic condition detector can be adapted to receive multiple signatures corresponding to multiple manufactured devices from the signature generator and to detect a systematic condition based on commonalities between the multiple signatures. For the purposes of this application, a systematic condition is defined as a condition (e.g., a state, relationship, behavior, or the like) which is detectable under test, which is observed in multiple devices that are manufactured according to the same ground rules and design, and which occurs non-randomly. The systematic condition is indicative of an underlying similarity (e.g., a similar characteristic, feature, defect, defect mechanism, etc.) that may be a root cause of the systematic condition being observed at test.

The systematic condition analyzer can be adapted to receive from the systematic condition detector each group of similar signatures that are indicative of a systematic condition. The systematic condition analyzer can further be adapted to analyze the systematic condition by analyzing the similar signatures, alone or in conjunction with additional information, in order to identify a list of underlying similarities (e.g., similar characteristics, features, parameters, defects, defect mechanisms, etc.). These underlying similarities are indicative of the potential root causes of the systematic condition (i.e., indicative of the likely causes of the systematic behavior being exhibited at test). The additional information can comprise one or more of the following: known root causes of known signatures stored in the signatures database, design information, manufacturing process information, performance information and/or diagnostic testing information.

The signature database can be adapted to store analysis results, including lists of potential or known root causes for identified systematic conditions, as determined by the systematic condition analyzer.

The systematic condition analyzer can further be adapted to output analysis results to support various feedback loops and/or to be used to bin or disposition the devices, based on identified systematic conditions and/or underlying similarities, respectively.

For example, in a first feedback loop the analysis results can be output in order to refine the detection and analysis processes. That is, the analysis results can be output to the signature definitions selector and/or the data selector. The signature definitions selector can be adapted to automatically create a revised set of the signature definitions (i.e., a modified or completely new set of signature definitions), based on the analysis results and/or the data selector can be adapted to automatically select different testing data based on the analysis results. The different testing data can comprise different types of testing data and/or testing data from a different or modified population of devices. The signature generator can further be adapted to generate new signatures using the revised set of signature definitions and/or the different testing data. Next, the systematic condition detector can further be adapted to detect the systematic condition in other devices based on the new signatures. Additionally, the systematic condition analyzer can further be adapted to amend the list of potential root causes of the systematic condition based on the new signatures and, optionally, additional information, including other known root causes of other known signatures stored in the signatures database.

In a second feedback loop, the analysis results can be output to update yield analysis. That is, the analysis results can be output to a yield analyser. This yield analyzer can be adapted to use analysis results in addition to other information and data provided to the yield analyzer regarding design, manufacture, test and known root causes of known signatures in order to make a determination regarding whether or not the systematic condition is a yield detractor and, if so, to revise yield predictions and quantifications.

In a third feedback loop, the analysis results can be output in order to update ground rules, design specifications and layout, manufacturing processes, testing techniques and/or datalogging procedures. For example, ground rules, design specifications and layout, and manufacturing process can be updated so as either to avoid or eliminate device characteristics that negatively impact yield or to promote device characteristics that positively impact yield. Testing techniques may be updated in order to better identify device characteristics that are determined to be the root cause of systematic conditions. Finally, datalogging procedures can be updated in light of identified root causes for systematic conditions.

Also disclosed are embodiments of an associated method and service for detection and analysis of systematic conditions occurring in manufactured devices as well a program storage device readable by computer and tangibly embodying a program of instructions executable by that computer to perform this method.

These embodiments each comprise testing a plurality of identical devices (i.e., devices manufactured according to the same design and same ground rules) in a particular identical and repeatable way, using any number of conventional testing techniques. The results of the test can be observed in some fashion and stored as collected data along with other testing information (e.g., testing conditions, power metrics, etc.).

Specific testing data can be selected from amongst all the data collected and stored during testing. Data selection is based on signature definitions in the initial set and/or on user input. Selected data can include specified observation points (e.g., specified electrical properties, specified physical properties, specified performance information, etc.).

The selected data and other testing information (e.g., specified environmental information, any statistically abnormal data, specified power metrics, specified electrically coded information and specified manufacturing process information) can then be received by a signature generator.

An initial set of signature definitions is also received by a signature generator. Signature definitions can comprise, for example, electrical properties, physical properties, performance information, environmental information, statistically abnormal data, power metrics, electrically coded information and manufacturing process information. The initial set of signature definitions can be selected by default or user-selected.

Next, a unique signature is generated for each manufactured device based on this initial set of signature definitions and the values for those signature definitions as derived from the selected data and, if applicable, from the other testing information. Specifically, each signature comprises values for the initial set of signature definitions and these values are derived from selected testing data.

Next, a systematic condition is detected based on commonalities between multiple signatures corresponding to multiple devices. For the purposes of this application, a systematic condition comprises a condition (e.g., a state, relationship, behavior, or the like) that is observed during test of each of the multiple devices and that occurs non-randomly. The systematic condition is indicative of an underlying similarity (e.g., a similar characteristic, feature, defect, defect mechanism, etc.) that is a root cause of the systematic condition being observed at test.

Once a systematic condition is detected, it is analyzed by analyzing the multiple signatures, alone or in conjunction with additional information, to develop a list of any underlying similarities between the multiple devices that are potential root causes of the systematic condition. Such additional information can comprise known root causes of known signatures, design information, manufacturing process information, performance information, diagnostic testing information, etc.

The analysis results, including lists of potential or known root causes, for identified systematic conditions, as determined by the systematic condition analyzer are then stored, e.g., in a signature database. Additionally, the analysis results can be output to support various feedback loops and/or to be used to bin or disposition the devices, based on identified systematic conditions and/or underlying similarities, respectively.

For example, a first feedback loop can comprise outputting the analysis results in order to refine the detection and the analysis processes. That is, based on output analysis results, a revised set of the signature definitions (i.e., a modified or completely new set of signature definitions) can automatically be created (e.g., by a signature definitions selector) and/or different testing data can automatically be selected (e.g., by a data selector). The different testing data can comprise different types of testing data and/or testing data from a different or modified population of devices. Then, new signatures can be generated (e.g., by a signature generator) using the revised set of signature definitions and/or the different testing data. Next, the systematic condition can be detected in other devices based on the new signatures (e.g., by the systematic condition detector). Additionally, the list of potential root causes of the systematic condition can be analyzed (e.g., by the systematic condition analyzer) based on the new signatures and, optionally, on additional information, including other known root causes of other known signatures stored in the signatures database.

A second feedback loop can comprise outputting the analysis results in order to update yield analysis. That is, analysis results can be used (e.g., by a yield analyzer) in addition to other information and data regarding design, manufacture, test and known root causes of known signatures in order to make a determination regarding whether or not the systematic condition is associated with yield variation and, if so, to revise yield predictions and quantifications.

A third feedback loop comprises outputting the analysis results in order to update ground rules, design specifications and layout, manufacturing processes, testing techniques and/or datalogging procedures. For example, ground rules, design specifications and layout, and manufacturing process can be updated in order to either avoid or eliminate device characteristics that negatively impact yield or to promote device characteristics that positively impact yield. Testing techniques may also be updated in order to better identify device characteristics that are determined to be the root cause of systematic conditions. Finally, datalogging procedures can be updated (e.g., made more efficient) in light of identified root causes for systematic conditions.

Additionally, these embodiments can comprise using the analysis results for binning or dispositioning the multiple devices, based on the systematic condition and/or the underlying similarities.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
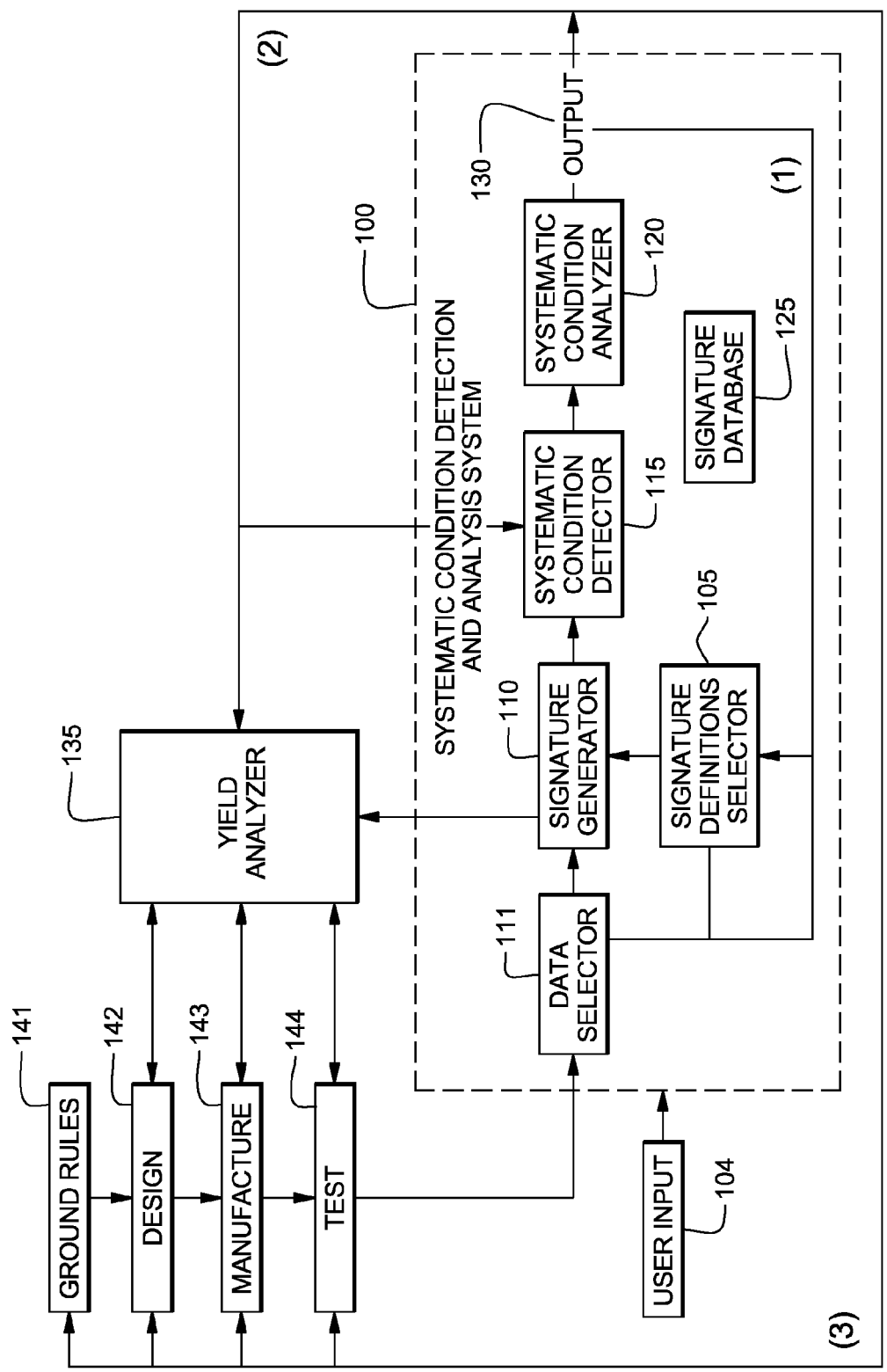
FIG. 1 is a schematic diagram representing an embodiment of the system of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, device (e.g., chip, integrated circuit, circuit, network, etc.) processing includes establishing ground rules, designing the device, manufacturing a plurality of devices according to the established ground rules and design, and testing the manufactured devices prior to distribution to customers. Similarities between devices can similarly affect device behavior. That is, defects or other characteristics that are common to devices manufactured according to the same ground rules and the same design can cause those devices to achieve similar results under test (i.e., to behave or respond the same way under test).

In view of the foregoing, disclosed herein are embodiments of a system, method and service for detecting and analyzing systematic conditions occurring in devices that are manufactured according to the same design and ground rules. Also disclosed are embodiments of a program storage device readable by computer and tangibly embodying a program of instructions executable by that computer to perform this method. Each of the embodiments comprises generating a unique signature (i.e., performance signatures) for each of multiple tested devices. The unique signatures are generated based on an initial set of signature definitions and the values for those signature definitions that are derived at least in part from selected testing data. Systematic conditions (i.e., states, relationships, behaviors, etc., that are detectable under test and that occur non-randomly in devices manufactured according to the same ground rules and design) are detected based on commonalities between the signatures. The systematic condition is then analyzed, alone or in conjunction with additional information, in order to develop a list of underlying similarities between the devices. The analysis results can be used to refine the systematic condition detection and analysis processes by revising the signature definitions set and/or by modifying data selection. The analysis results may also be used to update yield analysis, ground rules, design and layout, manufacturing processes, testing techniques, datalogging procedures, and/or device binning or disposition procedures.

More particularly, referring to FIG. 1 embodiment of the system 100 comprises a signature definitions selector 105, a data selector 111, a signature generator 110, a systematic condition detector 115, a systematic condition analyzer 120 and a signature database 125.

At test a plurality of identical devices (i.e., devices manufactured according to the same design and same ground rules) can be tested in a particular identical and repeatable way, using any number of conventional testing techniques. The results of the test can be observed in some fashion and stored as collected data along with other testing information (e.g., testing conditions, power metrics, etc.).

The signature generator 110 can be adapted to receive selected testing data and other testing information from the data selector 111. The selected testing data is selected by the data selector 111 from amongst all the data collected and stored during testing. Data selection is based on signature definitions in the initial set and/or on user input. Selected data can include specified observation points (e.g., specified electrical properties, specified physical properties, specified performance information, etc.). Other testing information can include, but is not limited to, specified environmental information, any statistically abnormal data, specified power metrics, specified electrically coded information and specified manufacturing process information.

The signature generator 110 is further adapted to receive an initial set of signature definitions from the signature definitions selector 105. Signature definitions can comprise, for example, electrical properties, physical properties, performance information, environmental information, statistically abnormal data, power metrics, electrically coded information and manufacturing process information. For example, the signature definitions in a set can include any one or more of the following: fail data (e.g., data based on unique pins, unique latches, pattern-pin, pattern-pin-bit, pattern-pin-bit-state, etc.); supply current in the quiescent state (Iddq); in-line and post-manufacture parametric data; minimum voltage (Vmin); maximum voltage (Vmax); performance data; power metrics data; complex signature definitions (e.g., signature definitions that include data associated with the device, such as, logical or physical design, process, logistics data, test information, etc.); electrically coded information (e.g., ECID, process, test set, test conditions, etc.), environmental information (e.g., temperature, voltage, humidity, noise, light, etc.); physical properties (e.g., as determined based on the results from tests, such as, photoemission microscopy (PEM), laser scanning microscopy (LSM), picosecond imaging circuit analysis (PICA) etc., in response to stimulation from energy sources, such as laser, light, EMF, radiation, sound, heat, etc.); manufacturing information (e.g., process steps, dates, operations, tools, chambers, etc.); signature definition annotations; etc. The signature definition annotations can reference the significance of a particular definition. These signature annotations can include, but are not limited to, the following: critical area; layer content; physical features; backcones; presence or absence or quantity of the feature, net, cell, or layer; adjacency; proximity; performance or power metrics; the presence or absence or quantity of a defect; the sensitivity or tolerance to a defect; etc. For example, a signature annotation may comprise the map of critical area or feature to test observation points to create a signature, where the signature is stated in terms of fail data, but equates to critical area or feature. The initial set of signature definitions can comprise a default set, a user selected set or a user-customized set.

The signature generator 110 can further be adapted to generate a unique signature for each manufactured device based on this initial set of signature definitions and the values for those signature definitions as derived from the selected data and, if applicable, from other testing information. That is, each unique signature comprises a combination of specific data values and other pieces of information that are accumulated regarding the tested device. The specific data values and other pieces of information accumulated are those data values and other pieces of information corresponding to each signature definition in the initial set of signature definitions. Thus, the unique signature can be used as an identifier for the device itself.

The systematic condition detector 115 can be adapted to receive multiple signatures corresponding to multiple manufactured devices from the signature generator and to detect a systematic condition based on commonalities between the multiple signatures. For the purposes of this application, a systematic condition is defined as a condition (e.g., a state, relationship, behavior, or the like) which is detectable under test, which is observed in multiple devices that are manufactured according to the same ground rules and design, and which occurs non-randomly. The systematic condition is indicative of an underlying similarity (e.g., a similar characteristic, feature, defect, defect mechanism, etc.) that may be a root cause of the systematic condition being observed at test. Identifying commonalities between the signatures can, for example, be accomplished using logic commonality techniques as disclosed in U.S. Pat. No. 6,880,136 to Huisman, et al., issued on Apr. 12, 2005 and incorporated herein by reference. Using such abstract signatures, allows systematic conditions to be detected by the detector 115 without dependence upon more costly diagnostic testing and/or defect localization techniques.

The systematic condition analyzer 120 can be adapted to receive from the systematic condition detector 115 each group of similar signatures that are indicative of a systematic condition. The systematic condition analyzer 120 can further be adapted to analyze the systematic condition by analyzing the similar signatures in order to identify a list of underlying similarities (e.g., similar characteristics, features, parameters, defects, defect mechanisms, etc.). These underlying similarities are indicative of the potential root causes of the systematic condition (i.e., are indicative of the likely causes of the systematic behavior being exhibited at test). Analysis of the signatures can include, but is not limited to, common mode signature analysis, partial signature analysis, signature classification, etc.

Figure 2:
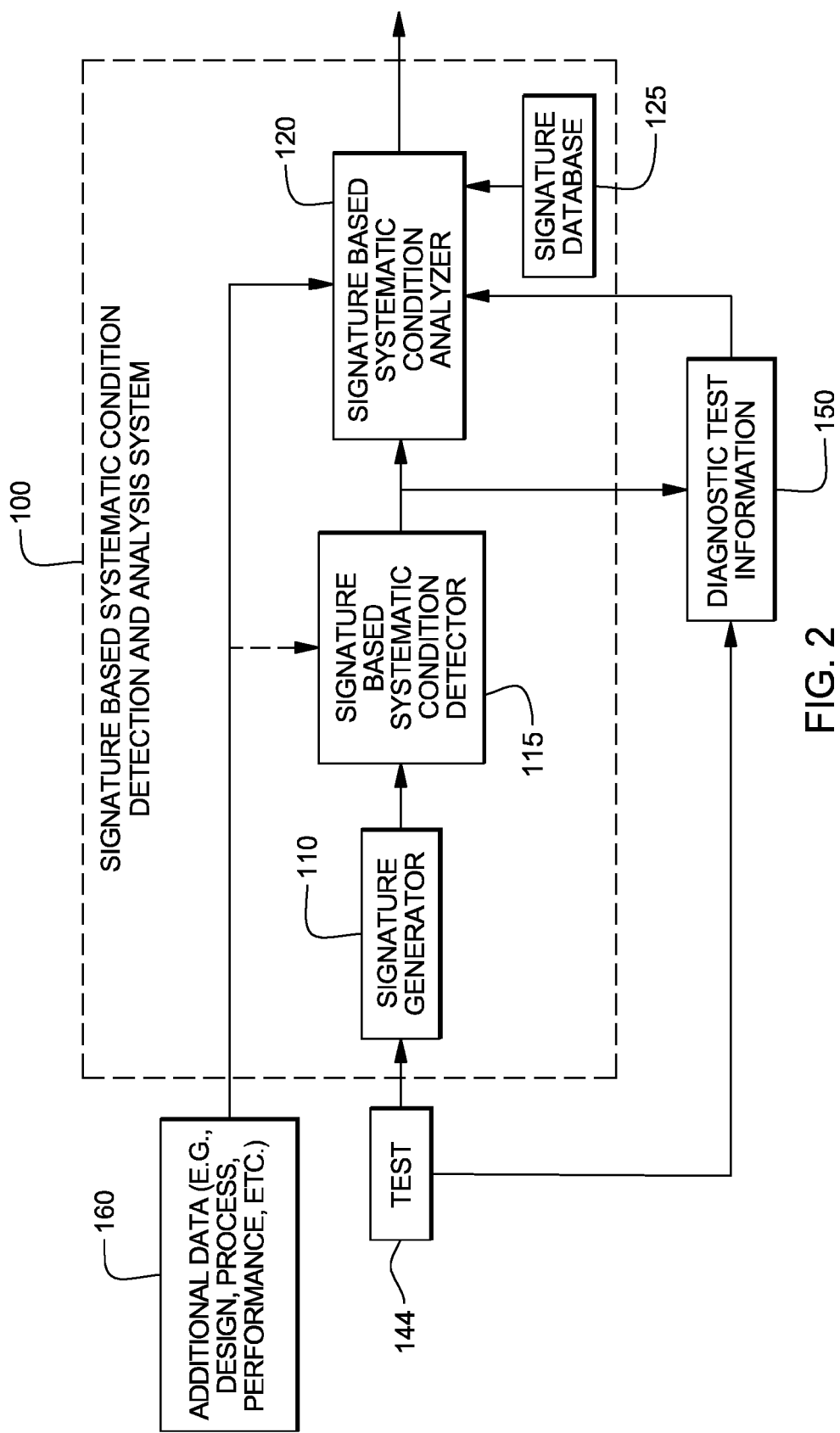
FIG. 2 is a schematic diagram representing alternative embodiments of the system of the invention.

Optionally, referring to FIG. 2, the analysis by the systematic condition analyzer 120 can also include an analysis of additional information. This additional information can comprise one or more of the following: known root causes of known signatures stored in the signatures database 125 (see discussion below); design, manufacturing process and performance information 160; and/or diagnostic testing information 150. That is, the systematic condition analyzer 120 can be adapted to analyze the signatures in conjunction with additional information.

For example, the analyzer 120 can be adapted to use signature data previously stored in the signature database 125. The signature database 125 can include lists of known signatures representing known systematic conditions having known root causes, signatures for flawless devices, etc. This analyzer 120 can further be adapted to include analysis of the similar signatures themselves.

The analyzer 120 may also be adapted to analyze diagnostic tests 150 performed on one or more of the devices in response to the detection of a systematic condition by the detector 115. These diagnostic tests 150 can be used to isolate a common defect (i.e., a similar defect between the devices that is the potential root cause of the systematic condition). Specifically, in response to a detected systematic condition, diagnostic testing 150 can be accomplished using conventional Cadence Encounter Test chain and logic diagnostics, based on simulation, and/or physical fault isolation techniques, such as photon emission or soft defect isolation techniques. The analysis by the analyzer 120 can incorporate the use of signature data in conjunction with the results of the diagnostic testing 150 (i.e., can use diagnostic callouts, such as faults or defect locations) and optionally other information 160, 125. For example, the analysis can include, but is not limited to, the following diagnostic analysis techniques: diagnostic callout hot spot analysis, statistical analysis of circuit net, process level, critical structure and location, learning based diagnostic analysis, etc.

As mentioned above, the signature database 125 can be adapted to store signature data, including signature analysis results (i.e., lists of potential or known root causes for identified systematic conditions) and signature data related to flawless devices, as determined by the systematic condition analyzer.

The systematic condition analyzer 120 can further be adapted to output analysis results to support various feedback loops and/or to be used to bin or disposition the devices, based on identified systematic conditions and/or underlying similarities, respectively.

For example, referring again to FIG. 1, in a first feedback loop (1) the analysis results can be output 130 in order to refine the detection and analysis processes. That is, the analysis results from the systematic condition analyzer 120 can be output to the signature definitions selector 105 and/or the data selector 111. The signature definitions selector 105 can be adapted to automatically create a revised set of the signature definitions, based on the analysis results and/or the data selector 111 can be adapted to automatically select different testing data based on the analysis results.

Creation of a revised set of signature definitions can include modifying the initial set of signature definitions. For example, the initial set can be modified by adding or removing signature definitions from the initial set or by combining the initial set with several known signature definition sets. Alternatively, a completely new set of signature definitions can be created. The different testing data can comprise different types of testing data and/or testing data from a different or modified population of devices.

More specifically, the revised set of signature definitions can be created specifically so that newly generated signatures will target detection of the systematic condition in the same circuit (i.e., same location) on other devices, will target detection of the same type of systematic condition in similar circuits, will rule out some of the probable root causes on the list and/or will add to the probable root causes on the list. Additionally, the revised set of signature definitions can be based on knowledge of design, manufacturing processes and testing as well as based on an extrapolation of the systematic condition to a broader spectrum of the design.

For example, using bit correspondence or design information a particular systematic condition can be derived or extrapolated to a possible aggregate systematic condition (i.e., to determine what conditions are common across similar circuit groups). Thus, in a circuit space, a fail can also represent instances of fails in a group of similarly susceptible circuits. In a design space, a fail can represent instances of fails in multiple identical cores in the design. With common features, layers, etc., fault simulation can translate from design space to signature space. Then, revised signature definition sets (i.e., new and/or aggregate signature definition sets) can be based on the extrapolation and signature derivation described above.

The following are examples of how signature definition sets may be revised to refine systematic condition detection and analysis.

In one example, an initial systematic condition is detected (e.g., if logic fail signature commonality has identified a group of similar signatures) and the root cause is determined to be due to a process sensitivity of a particular structure in the layout (e.g. an open input to a particular circuit). This one instance of the structure appears as a systematic condition at the most sensitive place in the design; however, other instances of the same structure are also susceptible to the underlying process—design interaction. The signature definitions set should be changed to better quantify the yield impact of this condition (e.g., the signature definition set can be revised to better identify a floating input by including voltage measurement data in the signature, or by identifying all the fail latches associated with the susceptible structures and building an aggregate signature, or by defining the signature in terms of the susceptible circuits in back trace cones).

In another example, the root cause of a systematic condition such as a particular failing device may be a short. The initial set of signature definitions may comprise IDDQ pass/fail data. The revised set of signature definitions may also incorporate IDDQ pattern measurement data to detect a particular systematic condition.

In another example, a unique latch signature may be associated with a systematic condition on one p/n in a particular circuit, macro, or core. This signature definition may be revised by using bit correspondence to create a composite signature including other instances of the same circuit, macro, or core in the design, or a cross p/n bit correspondence signature for a common macro/core in multiple p/ns or designs.

In yet another example, different signature definitions can be used for the revised set based on the values in the initial set of signature definitions. For example, when a chain systematic condition is identified based on chain and wafer regionality, wafer regionality can also be used to identify logic systematic defects with possibly the same root cause mechanism.

In yet another example, different signature definitions can be used for the revised set based on different hardware. For example, when a systematic condition is identified in one p/n manufactured in a particular technology, based on design, a revised set of signature definitions can be used to identify systematic conditions in other p/ns in the same or different technologies.

The signature generator 110 can further be adapted to generate new signatures using the revised set of signature definitions and/or the different testing data. Given the revised set of signature definitions, the new signature may include more or less attributes than the previous signature. Next, the systematic condition detector 115 can further be adapted to detect the systematic condition in other devices or in similar circuits on the same device based on these new signatures.

Additionally, the systematic condition analyzer 120 can further be adapted to amend the list of potential root causes of the systematic condition based on the new signatures and, optionally, also based on additional information, include other known root causes of other known signatures stored in the signatures database 125. Thus, a root cause can be extrapolated from one layer to another with an aggregate signature created for each new layer.

Referring again to FIG. 1, in a second feedback loop (2), the analysis results from the systematic condition analyzer 120 can optionally be output 130 to update yield analysis. That is, the analysis results can be output 130 to a yield analyser 135. This yield analyzer 135 can be adapted to use analysis results in addition to other information and data provided to the yield analyzer 135 regarding design 142, manufacture 143, test 144 and known root causes of known signatures (e.g., see signatures database 125) in order to make a determination regarding whether or not the systematic condition is a yield detractor and, if so, to revise yield predictions and quantifications. More specifically, the yield analyzer 135 can be adapted to identify signatures and/or groups of signatures that are yield detractors and then can predict and quantify the yield loss associated with a particular signature or group of signatures.

In a third feedback loop (3), the analysis results can be output 130 in order to update ground rules, design specifications and layout, manufacturing processes, testing techniques and/or datalogging procedures. For example, ground rules 141, design specifications and layout 142, and manufacturing processes 143 can be updated so as to either avoid or eliminate device characteristics that negatively impact yield or to promote device characteristics that positively impact yield. Additionally, datalogging procedures can be updated in light of identified root causes for systematic conditions. Finally, testing techniques 144 may be updated in order to better identify device characteristics that are determined to be the root cause of systematic conditions.

For example, test patterns to be used during testing and/or test applications to be used during testing can be changed based on the analysis results to better target or screen for the systematic condition, etc. That is, if a systematic condition is detected from signatures or aggregate signatures (i.e., signatures generated based on revised signature definition sets), those systematic conditions can be targeted for test generation. The test application conditions can also be selected, organized and/or changed, based on a detected systematic condition and specific test patterns may be removed or shifted in time in the test application sequence. Screen patterns can also be developed such that a pass or fail will indicate the presence or absence of the systematic condition represented by a known signature, which can in turn be used to disposition devices instead of or in addition to other tests. Additionally, changes based on signatures and/ or systematic conditions may be made at test to datalogging techniques (i.e., to manage data collection) so as to reduce test time, reduce cost, manage fail data volume and sample size.

For example, if the signature includes process tool "RPQ", then at test, screening patterns may be applied, and signatures generated from the screen data checked for signatures associated with systematic focus problems. In another example, if the signature includes process tool "ABC" and process temperature below a threshold, T, then signatures may be reviewed for the known aggregate signature associated with these conditions and the appropriate disposition criterion chosen for the hardware. In yet another example, if the signature includes test results showing Vmin is greater than a threshold, then at test, additional test coverage may be applied at low voltage and addition data collected, such as logic fail data and IDDQ parametric measurements. In another example, test patterns are created to screen for "defective behavior" at particular locations, that have been identified based on in-line, mask, OPC, identify locations in the reticle that are more susceptible to a particular failure, performance, power "defect" mechanism than other identical structures in the layout.

The analysis results may also be output 130 and used to bin or disposition the devices, based on identified systematic conditions and/or underlying similarities, respectively.

Figure 3:
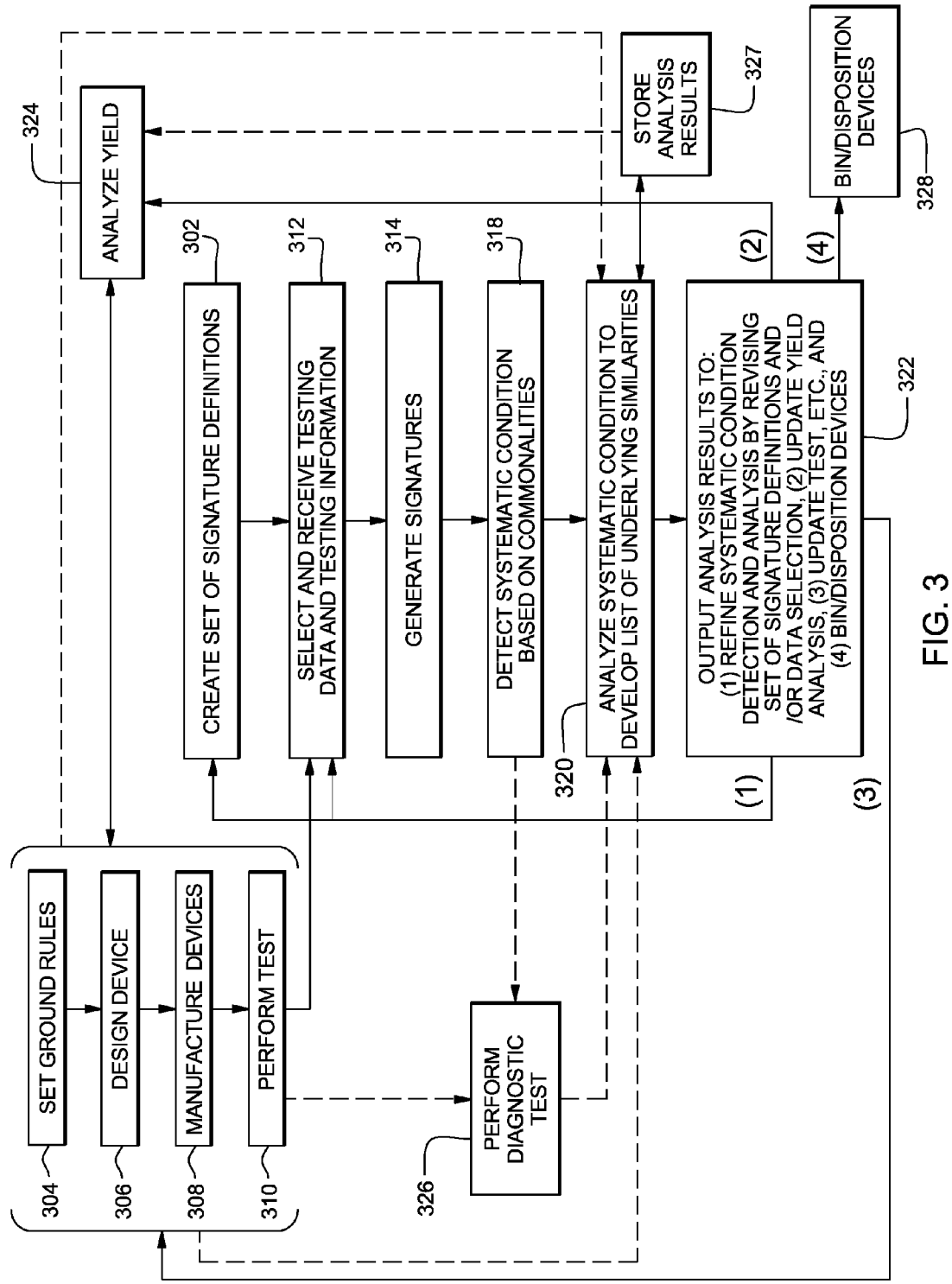
FIG. 3 is flow diagram illustrating an embodiment of the method the invention.

Referring to FIG. 3 in combination with FIG. 1, also disclosed are embodiments of an associated method and service for detection and analysis of systematic conditions occurring in manufactured devices.

The method and service embodiments comprise creating an initial set of signature definitions (302). Specifically, the initial set of signature definitions can be created, for example, by a signature definitions selector 105 and can comprise a default or user-selected set from a database of signature definition sets and/or a user-customized set. Exemplary signature definitions can include, but are not limited to, specified observation points (e.g., specified electrical properties, specified physical properties, specified performance information, etc.) as well as other information including but not limited to specified environmental information, any statistically abnormal data, specified power metrics, specified electrically coded information and specified manufacturing process information (see detailed discussion of signature definitions above). This initial set of signature definitions can be output to and received by a signature generator 110 of system 100.

Then, following the setting of ground rules and the designing and manufacturing of a plurality of identical devices (e.g., chips, dies, integrated circuits, etc.) (304-306), a plurality of identical devices (i.e., devices manufactured according to the same design and same ground rules) are tested in a particular identical and repeatable way, using any number of conventional testing techniques (310). The results of the test can be observed and selected data can be output to the systematic defect detection and analysis system 100 of the present invention along with other testing information (e.g., test conditions, power metrics, etc.).

Specifically, some portion of the testing data can be selected (e.g., by a data selector 111) from amongst all the testing data that is collected and stored during testing and this selected data can be output to the system 100 such that it is received by the signature generator 110 (see FIG. 1) (312). Data selection is based on signature definitions in the initial set and/or on user input. Selected data can include specified observation points (e.g., specified electrical properties, specified physical properties, specified performance information, etc.). During this process, other testing information (e.g., specified environmental information, any statistically abnormal data, specified power metrics, specified electrically coded information and specified manufacturing process information) can also be received by the signature generator 110.

Next, a unique signature is generated (e.g., by the signature generator 110) for each manufactured device, based on this initial set of signature definitions and the values for those signature definitions as derived from the selected data and, if applicable, from the other testing information (314). Specifically, each unique signature comprises a combination of specific data values derived from selected testing data and from other pieces of information that are accumulated regarding the tested device. The specific data values and other pieces of information accumulated are those data values and other pieces of, relationship, behavior, or the like) that is observed during test of each of the multiple devices and that occurs non-randomly. The systematic condition is indicative of an underlying similarity (e.g., a similar characteristic, feature, defect, defect mechanism, etc.) that may be a root cause of the systematic condition being observed at test.

Once a systematic condition is detected, it is analyzed (e.g., by a systematic condition analyzer 120) by analyzing the multiple signatures, alone or in conjunction with additional information, to develop a list of any underlying similarities between the multiple devices (320). These underlying similarities are indicative of the potential root causes of the systematic condition. Such additional information can optionally include, but is not limited to, known root causes of known previously stored signatures 327, design information 306, manufacturing process information 308, performance information 310, diagnostic testing information 326, etc.

The analysis results, including lists of potential or known root causes, for identified systematic conditions, as determined by the systematic condition analyzer are then stored (327), e.g., in a signature database. Additionally, the analysis results can be output to support various feedback loops (322) and/or to be used to bin or disposition the devices, based on identified systematic conditions and/or underlying similarities, respectively (328).

For example, a first feedback loop (1) can comprise outputting the analysis results at process 322 in order to refine the detection and the analysis processes. That is, based on output analysis results, a revised set of the signature definitions (i.e., a modified or completely new set of signature definitions) can automatically be created (e.g., by a signature definitions selector) at process 302 and/or different testing data can automatically be selected (e.g., by a data selector) at process 312. The revised set of signature definitions can be created at process 302 specifically so that newly generated signatures at process 314 will target detection of the systematic condition in the same circuit (i.e., same location) on other devices, will target detection of the same type of systematic condition in a similar circuit, will rule out some of the probable root causes on the list and/or will add to the probable root causes on the list. Creation of the revised set of signature definitions can include modifying the initial set of signature definitions. For example, the initial set can be modified by adding or removing signature definitions from the initial set or by combining the initial set with several known signature definition sets. Alternatively, a completely new set of signature definitions can be created. Selection of different testing data can comprise selecting different types of testing data and/or selecting testing data from a different or modified population of devices.

Then, new signatures can be generated (e.g., by a signature generator) using the revised set of signature definitions and/or the different testing data at process 314. Next, the systematic condition can be detected in other devices based on the new signatures (e.g., by the systematic condition detector) (318). Additionally, the list of potential root causes of the systematic condition can be analyzed (e.g., by the systematic condition analyzer) based the new signatures and, optionally, on additional information, including other known root causes of other known signatures stored in the signatures database (320).

A second feedback loop (2) can comprise outputting at process 322 the analysis results in order to update yield analysis (324). That is, analysis results can be used (e.g., by a yield analyzer) in addition to other information and data regarding design 306, manufacture 308, test 310 and known root causes of known signatures 327 in order to make a determination regarding whether or not the systematic condition is a yield detractor and, if so, to revise yield predictions and quantifications.

A third feedback loop (3) can comprise outputting at process 322 the analysis results in order to update ground rules, design specifications and layout, manufacturing processes, testing techniques and/or datalogging procedures. For example, ground rules 304, design specifications and layout 306, and manufacturing processes 308 can be updated in order to either avoid or eliminate device characteristics that negatively impact yield or to promote device characteristics that positively impact yield. Testing techniques 310 may also be updated in order to better identify device characteristics that are determined to be the root cause of systematic conditions. Finally, datalogging procedures can be updated (e.g., made more efficient) in light of identified root causes for systematic conditions techniques so as to reduce test time, costs and fail data volume.

Additionally, these embodiments can comprise using the analysis results for binning or dispositioning the multiple devices, based on the systematic condition and/or the underlying similarities (328).

Also disclosed are embodiments of a program storage device readable by computer and tangibly embodying a program of instructions executable by that computer to perform the method described above.

The various embodiments described above of the invention can take the form of an entirely hardware embodiment, an entirely software embodiment or an embodiment including both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 4:
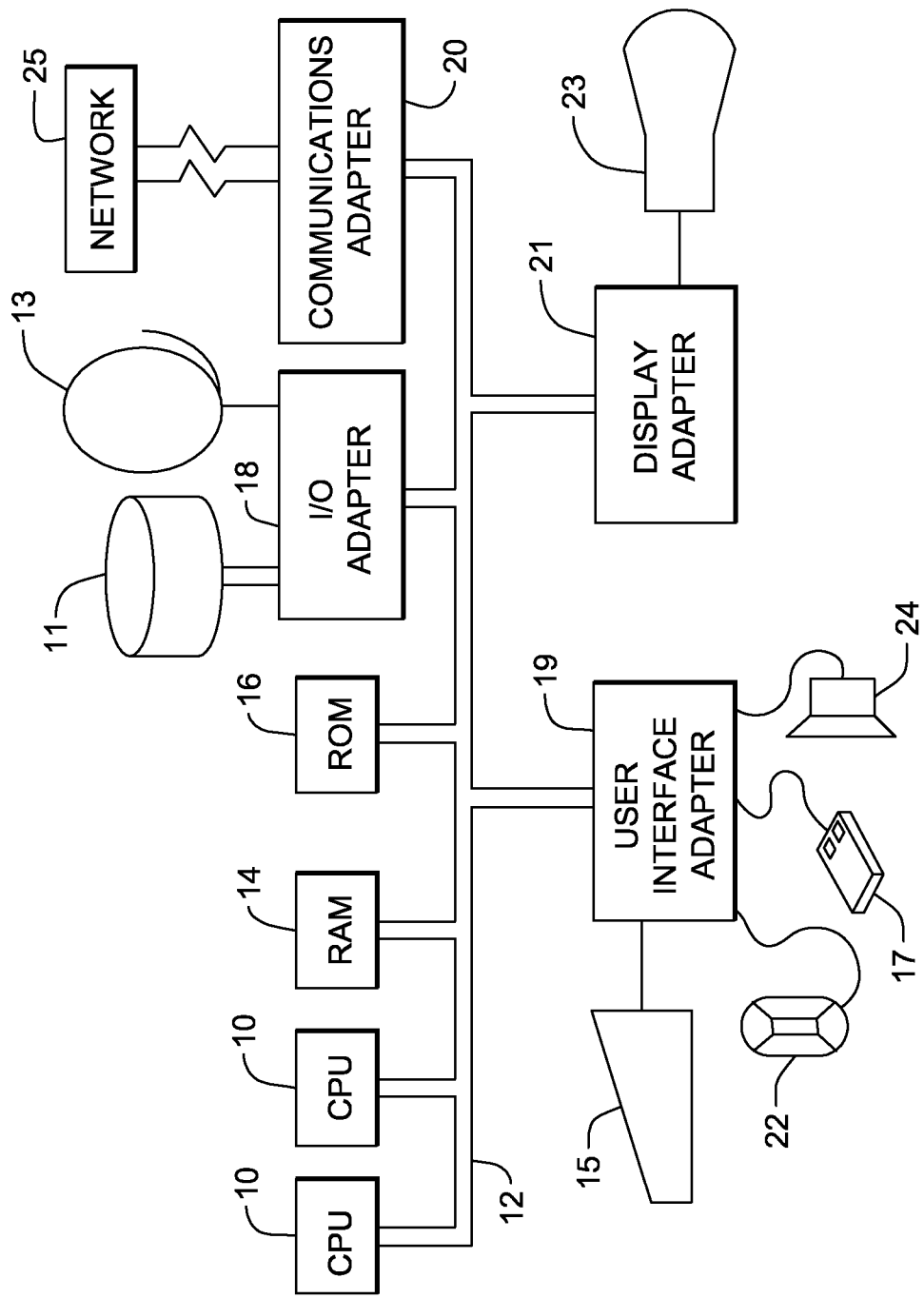
FIG. 4 is a schematic representation of a computer system suitable for use in implementing the system and method embodiments of the invention.

A representative hardware environment for practicing the embodiments of the invention is depicted in FIG. 4. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

Therefore, disclosed above are embodiments of a system, method and service for detecting and analyzing systematic conditions occurring in devices that are manufactured according to the same design and ground rules. Each embodiment comprises generating a unique signature for each of multiple tested devices. The unique signatures are generated based on an initial set of signature definitions and the values for those signature definitions that are derived at least in part from selected testing data. A systematic condition is detected based on commonalities between the signatures. The systematic condition is then analyzed, alone or in conjunction with additional information, in order to develop a list of underlying similarities between the devices. The analysis results can be used to refine the systematic condition detection and analysis processes by revising the signature definitions set and/or by modifying data selection. The analysis results may also be used to update yield analysis, ground rules, design and layout, manufacturing processes, testing techniques, datalogging procedures, and/or device binning or disposition procedures.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A system for detection and analysis of systematic conditions occurring in manufactured devices, said manufactured devices being manufactured according to same design and ground rules and said system comprising:
    a signature generator receiving testing results from essentially identical and repeatable testing performed on said manufactured devices and further generating, based on said testing results, corresponding signatures for said manufactured devices each signature comprising values for an initial set of signature definitions and said signature definitions comprising at least one of electrical properties, physical properties, performance information, environmental information, statistically abnormal data, power metrics, electrically coded information and manufacturing process information;
    a systematic condition detector in communication with said signature generator and detecting a systematic condition occurring in at least some of said manufactured devices based on commonalities between at least some of said corresponding signatures for said manufactured devices, said systematic condition comprising a condition that is observed and that occurs non-randomly;
    a systematic condition analyzer in communication with said systematic condition detector and analyzing said systematic condition by analyzing said at least some of said corresponding signatures having said commonalities to develop a list of underlying similarities between said at least some of said manufactured devices, said list comprising any of characteristics, features, parameters, defects and defect mechanisms indicative of at least one potential root cause of said systematic condition;
    a signature definitions selector; and
    a data selector,
    said systematic condition analyzer further outputting analysis results to at least one of said signature definitions selector and said data selector,
    said signature definitions selector further automatically creating a revised set of said signature definitions, based on said analysis results,
    said data selector further automatically selecting different testing data, based on said analysis results, and
    said signature generator further generating new signatures using at least one of said revised set and said different testing data.

2. The system of claim 1, said systematic condition detector further detecting said systematic condition in other devices, based on said new signatures.

3. The system of claim 1, said systematic condition analyzer further amending said list, based on at least one of said new signatures and other known signatures.

4. The system of claim 1, said systematic conditions analyzer further analyzing said systematic condition, based on additional information.

5. The system of claim 4, said additional information comprising at least one of known root causes of known signatures, design information, manufacturing process information, performance information, and diagnostic testing information.

6. The system of claim 1, signature definition selector further automatically creating said revised set by one of modifying said initial set and creating a completely new set.

7. The system of claim 1, said systematic condition analyzer further automatically outputting said analysis results to at least one of designers, manufacturers, testers and yield analyzers so that at least one of ground rules, design specifications and layout, manufacturing processes, testing, datalogging and yield analysis may be updated.

8. A method for detection and analysis of systematic conditions occurring in manufactured devices, said manufactured devices being manufactured according to same design and ground rules and said method comprising:
    receiving testing results from essentially identical and repeatable testing performed on said manufactured devices;
    generating, based on said testing results, corresponding signatures for said manufactured devices, each signature comprising values for an initial set of signature definitions and said signature definitions comprising at least one of electrical properties, physical properties, performance information, environmental information, statistically abnormal data, power metrics, electrically coded information and manufacturing process information;
    detecting a systematic condition occurring in at least some of said manufactured devices based on commonalities between at least some of said corresponding signatures for said manufactured devices, said systematic condition comprising a condition that is observed and that occurs non-randomly;
    analyzing said systematic condition by analyzing said at least some of said corresponding signatures having said commonalities to develop a list of underlying similarities between said at least some of said manufactured devices, said list comprising any of characteristics, features, parameters, defects and defect mechanisms indicative of at least one potential root cause of said systematic condition;
    at least one of creating a revised set of signature definitions, based on analysis results, and selecting different testing data, based on said analysis results; and
    generating new signatures using at least one of said revised set and said different testing data.

9. The method of claim 8, further comprising at least one of detecting said systematic condition in other devices based on said new signatures; and, amending said list based on at least one of said new signatures and other known signatures.

10. The method of claim 8, said analyzing of said systematic condition further comprising analyzing said systematic condition based on additional information.

11. The method of claim 10, said additional information comprising at least one of known root causes of known signatures, design information, manufacturing process information, performance information, and diagnostic testing information.

12. The method of claim 8, said creating of said revised set of signature definitions comprising one of modifying said initial set of signature definitions and creating a completely new set of signature definitions.

13. The method of claim 8, further comprising updating at least one of ground rules, design specifications and layout, manufacturing processes, testing, yield analysis and datalogging, based on said analysis results.

14. The method of claim 8, further comprising at least one of binning and dispositioning said at least some of said manufactured devices, based on said systematic condition.

15. A service for detection and analysis of systematic conditions occurring in manufactured devices, said manufactured devices being manufactured according to same design and ground rules and said service comprising:

receiving testing results from essentially identical and repeatable testing performed on said manufactured devices;

generating, based on said testing results, corresponding signatures for said manufactured devices, each signature comprising values for an initial set of signature definitions and signature definitions comprising at least one of electrical properties, physical properties, performance information, environmental information, statistically abnormal data, power metrics, electrically coded information and manufacturing process information;

detecting a systematic condition occurring in at least some of said manufactured devices based on commonalities between at least some of said corresponding signatures for said manufactured devices, said systematic condition comprising a condition that is observed and that occurs non-randomly;

analyzing said systematic condition by analyzing said at least some of said corresponding signatures having said commonalities to develop a list of underlying similarities between said at least some of said manufactured devices, said list comprising any of characteristics, features, parameters, defects and defect mechanisms indicative of at least one potential root cause of said systematic condition;

at least one of creating a revised set of signature definitions, based on analysis results, and selecting different testing data, based on said analysis results; and generating new signatures using at least one of said revised set and said different testing data.

16. The service of claim 15, said analyzing of said systematiac condition further comprising analyzing said systematic condition based on additional information.

17. The service of claim 16, said additional information comprising at least one of known root causes of known signatures, design information, manufacturing process information, performance information, and diagnostic testing information.

18. A computer program product comprising a computer-readable storage medium, said storage medium readable by a computer and storing a program of instructions executable by said computer to perform a method for detection and analysis of systematic conditions occurring in manufactured devices, said manufactured devices being manufactured according to same design and ground rules and said method comprising:

receiving testing results from essentially identical and repeatable testing performed on said manufactured devices;

generating, based on said testing results, corresponding signatures for said manufactured devices, each signature comprising values for an initial set of signature definitions and said signature definitions comprising at least one of electrical properties, physical properties, performance information, environmental information, statistically abnormal data, power metrics, electrically coded information and manufacturing process information;

detecting a systematic condition occurring in at least some of said manufactured devices based on commonalities between at least some of said corresponding signatures for said manufactured devices, said systematic condition comprising a condition that is observed and that occurs non-randomly;

analyzing said systematic condition by analyzing said at least some of said corresponding signatures having said commonalities to develop a list of underlying similarities between said at least some of said manufactured devices, said list comprising any of characteristics, features, parameters, defects and defect mechanisms indicative of at least one potential root cause of said systematic condition;

at least one of creating a revised set of signature definitions, based on analysis results, and selecting different testing data, based on said analysis results; and generating new signatures using at least one of said revised set and said different testing data.

* * * * *